United States Patent
Evans et al.

(10) Patent No.: US 6,919,623 B2
(45) Date of Patent: Jul. 19, 2005

(54) HYDROGEN DIFFUSION HYBRID PORT AND METHOD OF FORMING

(75) Inventors: Robert D. Evans, El Segundo, CA (US); David Bronson, San Marino, CA (US)

(73) Assignee: The Boeing Company, Chicago, IL (US)

(*) Notice: Subject to any disclaimer, the term of this patent is extended or adjusted under 35 U.S.C. 154(b) by 0 days.

(21) Appl. No.: 10/735,221

(22) Filed: Dec. 12, 2003

(65) Prior Publication Data

US 2005/0127488 A1 Jun. 16, 2005

(51) Int. Cl.[7] .............................................. H01L 23/02
(52) U.S. Cl. ........................ 257/680; 257/678; 257/682; 257/683
(58) Field of Search ................................ 257/680, 678, 257/682, 683

(56) References Cited

U.S. PATENT DOCUMENTS

| | | | |
|---|---|---|---|
| 4,833,102 A | | 5/1989 | Byrne et al. |
| 4,871,651 A | | 10/1989 | McCune, Jr. et al. |
| 5,268,533 A | * | 12/1993 | Kovacs et al. ............. 174/52.4 |
| 5,491,361 A | * | 2/1996 | Stupian et al. ............. 257/680 |
| 5,543,364 A | | 8/1996 | Stupian et al. |
| 5,707,757 A | | 1/1998 | Lee |
| 6,435,882 B1 | * | 8/2002 | Pitou ........................... 439/70 |
| 2004/0207071 A1 | * | 10/2004 | Shiomi et al. ............. 257/704 |

OTHER PUBLICATIONS

Philipp Schuesslar and Diane Felicianp–Welpe, "The Effects of Hydrogen on Device Reliability..and Insights on Preventing These Effects".

I.N. Kaganovich and T.V. Shikhaleava, "Hydrogen Absorption by Titanium Alloys", pp. 1005–1013, All–Union Institute of Light Alloys, U.S.S.R.

M. Thoma, "Hydrogen Embrittlement and Stress Corrosion Cracking of Titanium Alloys Caused by Cleaning Processes", 21st Annual Airline Plating and Metal Finishing Forum, Feb. 18–21, 1985, SAE Technical Paper Series.

B.V. Whiteson, D. L. Henry, and H, Taketani, "Localized Migration of Hydrogen in Dissimilar Titanium Alloy Welds", Mar. 1969, Western Metals Congress, Los Angeles CA, United States of America.

\* cited by examiner

Primary Examiner—Jasmine J. Clark
(74) Attorney, Agent, or Firm—McNees Wallace & Nurick LLC; Carmen Santa Maria

(57) ABSTRACT

A hydrogen diffusion port for use in a packaged electronic device. In one embodiment, the hydrogen window is characterized by a substantial absence of plating from the external surfaces of the cover the base. The hydrogen diffusion port is selected from the group of materials consisting of palladium and its alloys, platinum and its alloys and titanium and its alloys The cover is welded to the base, and the hydrogen diffusion port is affixed to an aperture in the cover. The port is affixed by a low temperature process that can be accomplished after the cover is attached to the base to form a housing and the housing is degassed, without compromising the electronics within the housing and that does not require a partial pressure of hydrogen (which may be reintroduced into the materials) to accomplish, such as by soldering the diffusion port into the cover aperture, or by swaging the diffusion port into the cover aperture.

31 Claims, 3 Drawing Sheets

HYDROGEN DIFFUSION HYBRID PORT AND METHOD OF FORMING

FIELD OF THE INVENTION

The present invention is directed to packaged electronic devices, and, more particularly, to such devices wherein the package structure limits the buildup of hydrogen concentration within the package.

BACKGROUND OF THE INVENTION

Electronic devices such as integrated circuits are relatively fragile and are easily damaged by mechanical impacts and some environmental effects such as corrosive fluids. To protect the electronic device during service, it is placed within a package structure. The package structure includes a housing that protects the electronic device, conducts heat away from the electronic device, and includes electrical feedthroughs to the electronic device.

The package structure housing is made of materials and platings selected in view of the operating requirements of the electronic device. Hydrogen is introduced into the package structure from several sources. The sources include base metal used for the construction of the device, such as KOVAR® and other iron based metals which have low thermal expansion coefficients. Attachment of electrical leads, which typically are brazed in place under a reducing atmosphere is another source of hydrogen. Plating finishes which are typically applied over the cover and braze alloy, such as the adhesion layer disclosed in U.S. Pat. No. 5,543,364 that are used to secure prior art venting packages and glue or braze materials used to seal the lid or cover to the base of the package, also discussed in U.S. Pat. No. 5,543,364, also undesirably devolve hydrogen into the package. Yet another source of hydrogen is any residual moisture that may remain in the package if it is hermetically sealed. Many of these materials and platings emit hydrogen gas gradually during service, so that the partial pressure of hydrogen within the package at or shortly after manufacture is at or near zero. Even after being placed in service, the devolution of hydrogen is very low, with partial pressures being of the order of $10^{-8}$ or $10^{-9}$ atmospheres. Nevertheless, this hydrogen gas may be detrimental to the performance of the electronic device. For example, gallium arsenide (GaAs) or indium phosphide (InP) integrated circuits may degrade in performance when exposed to hydrogen levels as low as 100 parts per million (ppm).

In those cases where the package structure is hermetic, the outgassed hydrogen gradually accumulates inside the confined interior of the package. Even when the hydrogen is outgassed through a vent, these vents operate by diffusion, which is a temperature dependent process, although the electronic packages are designed to operate at temperatures in the range of about $-25°$ C.$-125°$ C. ($-13°$ F.$-260°$ F.), so that venting is also a slow process. The accumulated hydrogen may eventually cause degradation of the electronic device. In some instances, such degradation is not of great concern because the packaged electronic device can be readily replaced when it shows signs of degradation. In other cases, such as where the electronic device is part of a space satellite system that requires high reliability and is not readily accessible for service, the hydrogen-induced degradation is of great concern.

Several techniques have been developed to reduce the incidence of hydrogen degradation. In one, the assembled package and its electronic device are outgassed in a vacuum at elevated temperature for extended periods prior to service. This approach, while operable to some degree, may not be satisfactory because the concentration of hydrogen in the package materials and platings is unknown. In such cases, even thousands of hours of pre-service vacuum outgassing may not be sufficient. It is apparent that some hydrogen gas remains in the packaging material even after outgassing. In another approach, the package is not hermetically sealed so that the evolved hydrogen can leak from the package. A non-hermetic package is generally not satisfactory, because environmental contaminants such as water vapor can leak into the package and lead to degradation of the electronic device.

There remains a need for a satisfactory approach to the avoidance of hydrogen degradation of packaged electronic devices. Thus, it is desirable to minimize the amount of hydrogen to the maximum extent possible, while also providing a means for removal of any remaining hydrogen that otherwise may be entrapped within the hermetically sealed package. This can best be accomplished by reducing or eliminating sources of hydrogen. The present invention fulfills this need, and further provides related advantages.

SUMMARY OF THE INVENTION

The present invention provides a packaged electronic device which minimizes the introduction of hydrogen into the packaged device during fabrication, while also providing for the removal of hydrogen that may devolve within the housing subsequent to fabrication. The housing is hermetic, so that no contaminants may enter the housing to damage the electronic device. The packaging and its electronic device need not be outgassed to remove hydrogen prior to use. No moving parts are required in the structure that avoids hydrogen buildup.

In accordance with the invention, a packaged electronic device comprises an electronic device mounted on a base, and a cover sealed to the base forming a housing enclosing the electronic device, the housing including a hydrogen diffusion port. The cover may have a wall comprising a first portion made of a first material having a relatively low diffusion rate of hydrogen therethrough, and a second portion extending through the thickness of the cover made of a second material having a catalyzed diffusion of hydrogen therethrough.

The electronic device is typically a thin-film electronic device incorporating layers of materials such as gallium arsenide or indium phosphide. The base preferably is made of a material such as aluminum, aluminum alloys, KOVAR® (an iron-nickel-cobalt alloy per Specification ASTM F15 (1998)) or Alloy 42 (an iron-nickel alloy per Specification ASTM F30 (2002)) and the like. Leads are attached to the base and the electronic device. These base materials characteristically all have low coefficients of thermal expansion so as to closely approximate the thermal expansion of insulators surrounding the leads extending through the base. Although the above-mentioned materials are exemplary, the base made of any material that can be joined to the cover and maintain an effective hermetic seal over the design temperature range. The electronic device may comprise field effect transistors (FETs), monolithic microwave integrated circuits (MMICs) application specific integrated circuits (ASICs) and complementary metal oxide semiconductors (CMOSs). A cover is welded to the base and over the electronic device to form a housing hermetically sealing the electronic device within. The cover further includes a metallic portion extending through its thickness that is permeable to hydrogen. This metallic portion is incorporated into an aperture extending through the cover thickness. The metallic portion forming a hydrogen port is joined to the cover by a low temperature process The metallic portion is permeable to hydrogen, but otherwise impermeable, so that the housing remains hermitically sealed. This hydrogenpermeable metallic portion which plugs the aperture may comprise a metal selected from the group consisting of palladium, platinum, titanium or their alloys. Preferred materials for the permeable metallic portion include commercially pure titanium, Ti-6Al -4V (6% Al, 4% V, 0.10% max C, 0.2% Fe, 0.015% max. H, 0.03% N, 0.20% max O and the balance titanium), Ti-3Al -2.5V (3.0% Al, 2.5% V, 0.05% max C, 0.13% Fe, 0.015% max. H, 0.01% N, 0.10% max O and the balance titanium). Unless otherwise specified herein, all material compositions are nominal, given in elemental percentages by weight, and the balance includes incidental impurities of an amount and character so as not to affect the beneficial properties of the composition.

The present invention results in an acceptably low level of hydrogen in prototype packaged electronic devices. The metallic portion is installed in the cover by a process that will minimize the long term release of hydrogen within the housing, while assuring that the metallic portion will remain within the aperture under substantially any environmental condition.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

Figure 1:
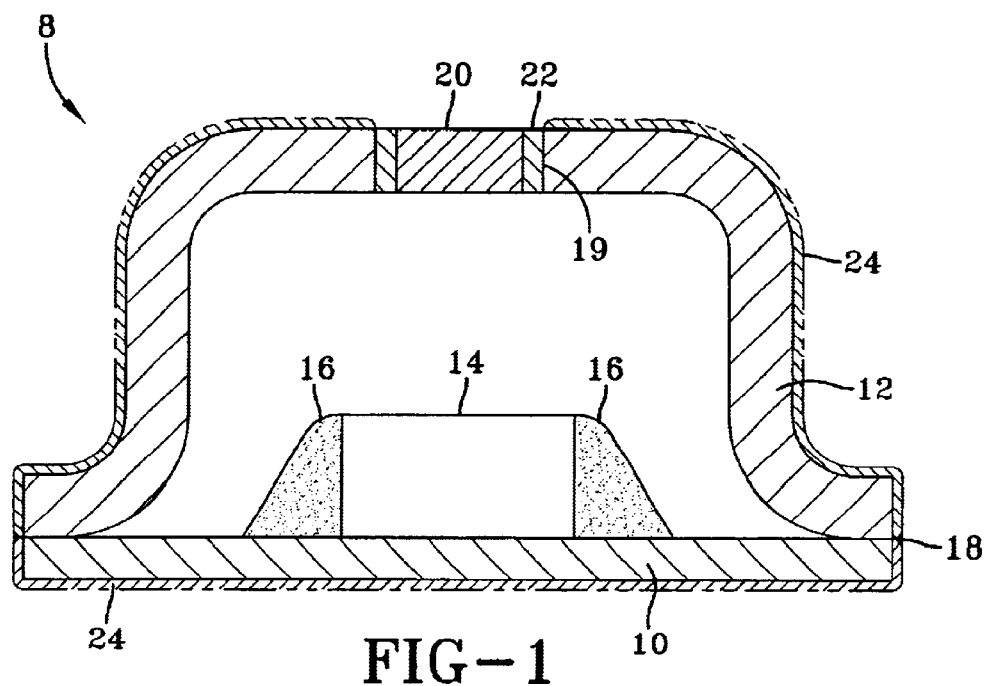
FIG. 1 is a sectional view of a prior art electronics package that includes a prior art hydrogen window.

FIG. 1 depicts a prior art packaged electronic device 8. The electronic device 14 is bonded to a base 10 by bonding material 16. A cover 12 is bonded to the base 10 at a joint 18 by a brazing material or a glue to form a hermetic seal over the electronic device. A cylindrical plug 20 which acts as a window to expel any build-up of hydrogen is inserted through cover 12. The plug 20 can be mechanically positioned within an aperture 19 in cover 12, such as by a press fit. Alternatively, the plug 20 also may be brazed into place by a braze alloy 22. The base 10 and cover 12, made of low expansion material, are protected from corrosion by application of a plating 24.

The prior art packaged electronic device 8 of FIG. 1 illustrates the sources of hydrogen that can devolve into the interior of the electronic device 8. There are other sources of hydrogen in addition to the obvious sources of hydrogen, such as the metallization of the electronic device itself with plating materials such as platinum or palladium layers, or small quantities of undetected moisture. For example, when the joint formed at 18 is a braze joint, it typically is plated, and the plating is a source of hydrogen. When this joint formed at 18 is a glue, it can gradually deteriorate over time in the presence of light and ultraviolet rays to yield oxygen and with possible loss of the hermetic seal. Other sources of hydrogen include the cover material and the base material. The material of base 10 and cover 12 typically is KOVAR®, which includes plating 24 on the exterior to prevent corrosion. Not only is hydrogen present in the KOVAR®, but also in the gold plating with a copper and/or nickel flash applied over the KOVAR® to prevent corrosion, and this hydrogen can migrate into the package. Another source of hydrogen is the hydrogen atmosphere used to attach leads (not shown) which are brazed in place on the KOVAR® base in a reducing atmosphere. Yet another source of hydrogen is plating 24 applied over the braze material 22, which bonds plug 20 in position. This source of hydrogen can be eliminated by pressing plug 20 into place within cover 12. The infirmity of this arrangement is that under very cold conditions, the press fit plug can separate from the hole and fall away from the hole, breaking the hermetic seal and leaving the interior of the package exposed to the environment.

Although the arrangement of FIG. 1 does include a hydrogen window, the removal of hydrogen through the window can be slow, and the partial pressure of hydrogen within the package can be sufficiently high to form hydrides within the package which aggressively attack the electronic device, leading to deterioration in operation, drift, and in more serious cases, failure of the electronic device. Baking of the device can remove some hydrogen, but the baking operation is performed at temperatures of about 100–165° C. (212–330° F.), which is insufficient to drive off sufficient hydrogen. Temperatures necessary to satisfactorily perform this function, are much higher, in the range of about 1000° C. (1830° F.), which would destroy the electronics.

Figure 2:
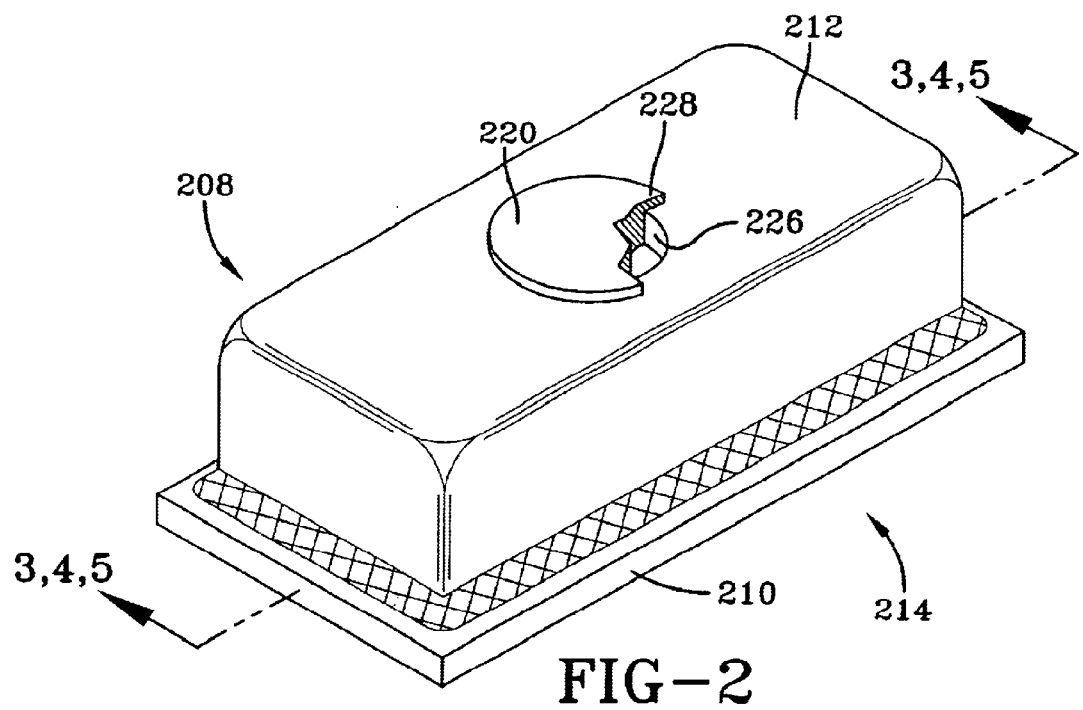
FIG. 2 is a perspective view of an electronics package that includes the hydrogen diffusion port of the present invention permitting the removal of hydrogen from the interior of the package

FIG. 2 depicts the packaged electronic device 208 of the present invention including a base 210 and a cover 212 comprising a housing 214. An electronic device 216 (not visible in FIG. 2, but illustrated in FIGS. 3, 4 and 5) is within the housing 214. Cover 212 includes an aperture 226. The aperture 226 is covered by the hydrogen port 220. The port 220 includes a flange 228 that rests on the cover 212 opposite the interior, the flange being dimensioned so that the flange 228 is larger than the aperture 226. In certain situations, as will be explained, this can prevent the port 220 from separating from the cover 212.

Figure 3:
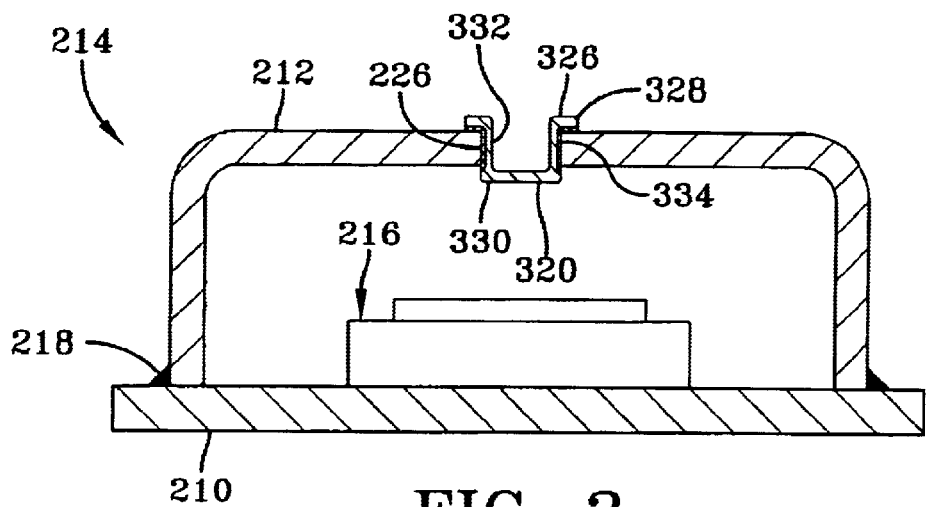
FIG. 3 is a sectional view of an embodiment of the present invention depicting a cup-shaped hydrogen diffusion port sealed hermetically to the cover by solder.
Figure 4:
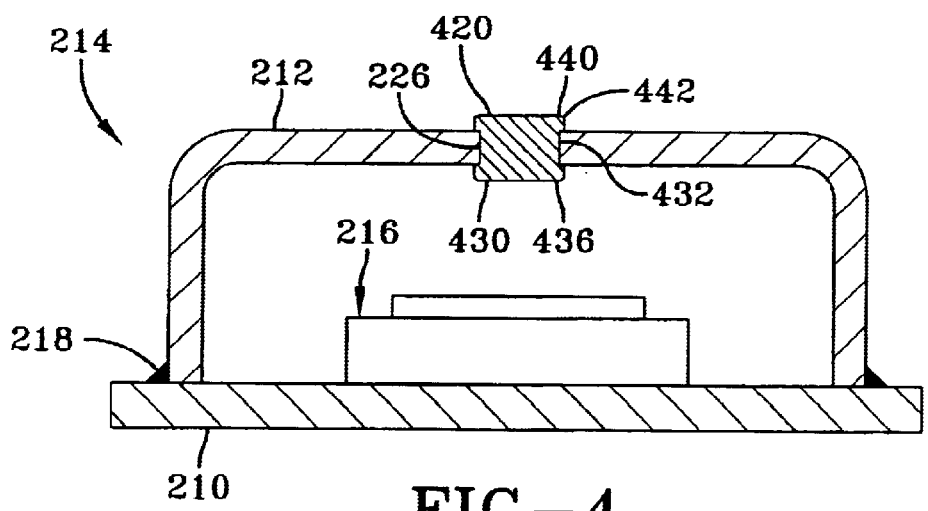
FIG. 4 is a sectional view of an embodiment of the present invention depicting a hydrogen diffusion port swaged to the cover.
Figure 5:
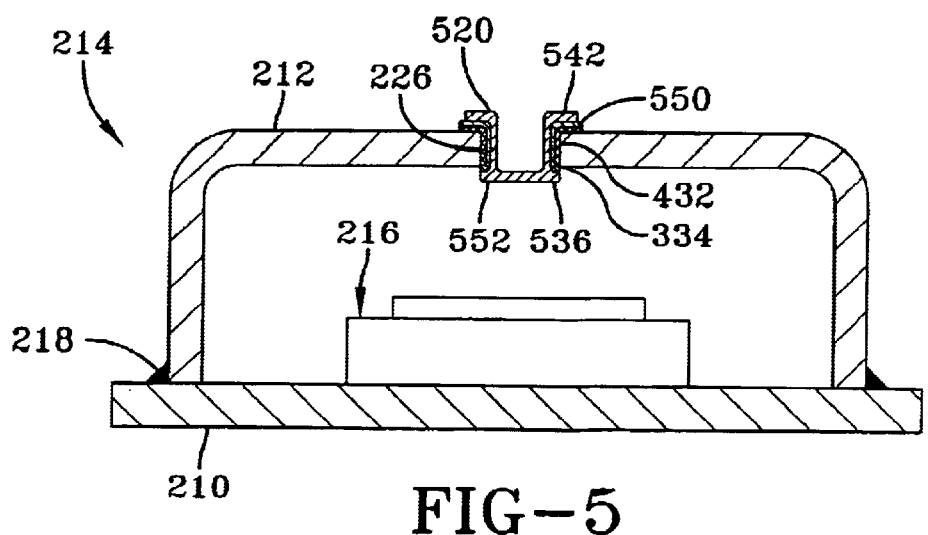
FIG. 5 is a sectional view of an embodiment of the present invention depicting a hydrogen diffusion port swaged into an intermediate metal and soldered to the cover

FIGS. 3, 4 and 5 illustrate different embodiments of the packaged electronic device 208 having the housing 214 that encloses the electronic device 216 of the present invention. The electronic device 24 may be of any operable type, such as for example, FETs, MMICs, ASICs, and CMOSs and the like. The invention is preferably applied in conjunction with microelectronic devices based upon gallium arsenide and indium phosphide layer architectures, which are used in high-speed microwave applications. Such devices are known in the art. The present invention is not concerned with the details of the structure of the electronic device itself, but only with the fact that the electronic device is present within the package and is potentially adversely affected by hydrogen gas that is evolved into the interior of the package from the package and materials during service.

Referring again generally to FIG. 2, each such packaged electronics device 208 includes a base 210, a cover 212 hermitically sealed to the base to form a housing 214. The electronic device 216 as described above is affixed to the base. The port 224 is installed in the cover in such a manner that the hermitically sealed housing is not adversely affected, regardless of the operating conditions experienced by the packaged electronics device 208. External electrical interconnects to the electronic device 216, not shown in the drawings, are made by any operable technique, such as pins, traces, vias, and the like, which are well known in the art. Various configurations and arrangements of these essential components as well as the techniques to hermetically seal the port within the cover make up the various embodiments of this invention. The term "hydrogen diffusion port" as used herein means a solid section or portion of the package through which hydrogen diffuses rapidly as compared with the remainder of the package. ("Port" as used herein does not include a grillwork, an opening, a mechanical valve which can be opened, or the like, which would permit convective flow of gas therethrough in both directions, thereby rendering the package non-hermetic.) The term "hydrogen diffusion port" or "hydrogen port" as used herein means a solid section or portion of the package through which hydrogen diffuses rapidly as compared with the remainder of the package.

Referring again to FIGS. 3, 4 and 5, the package includes a portion, which is preferably the cover 212, having a hydrogen diffusion port 220 therein. Referring now to FIG. 3, there is shown a first embodiment of the present invention that includes a cup shaped hydrogen diffusion port 320 installed into the cover 212. The cover 212 is attached to the base 210 by a weld 218 to form a housing 214. Whether the cover and/or the base is plated depends on the composition of the materials, as will be discussed. The hydrogen diffusion port is installed into the aperture 226 which is punched or otherwise formed in the housing. In this embodiment, the hydrogen port 320 is cup-shaped. The port base 330 has a diameter that is preferably the size of the diameter or aperture 226, so that it can be inserted through the aperture. However, the port base diameter may be smaller than aperture diameter. The outer diameter of a port wall 332 is slightly less than aperture diameter. Preferably, hydrogen diffusion port 320 includes an upper flange 328. Solder material 334 is positioned in the gap between the outer diameter of port wall 332 and diameter of aperture 226. This solder can be in the form of a foil, wire, paste, powder or the like. If desired, the solder can be inserted between the cover 212 and the hydrogen diffusion port 320 so that the hydrogen diffusion port does not contact the cover. After the hydrogen port is inserted into the cover with the solder, the assembly can be locally heated to a relatively low temperature and for a short time sufficient to melt the solder and form a bond between the hydrogen port 320 and the cover 212. Heat can be applied locally by a soldering iron or a hot plate, thereby heating only the region in the vicinity of the solder joint. Solder can be preplaced before heating or can be drawn into the gap between the port wall and aperture by capillary action, as is well known.

The hydrogen diffusion port is comprised of a material selected from the group consisting of platinum and platinum alloys, palladium and palladium alloys, and titanium and titanium alloys. Preferably, the palladium alloy is palladium copper (60% Pd/40% Cu). While the solder may be any material compatible with the cover and the diffusion port, the preferred solders are lead/tin (97%Pb/3%Sn; 95%Pb/5%Sn; 90%/Pb/10%Sn), eutectic gold/germanium (98% Au/2%Ge), and eutectic gold/tin (80%Au/20% tin).

This embodiment of the invention has several advantages over the prior art devices and processes. Importantly, a soldering operation to insert hydrogen port 320 is accomplished at temperatures below about 700° C. (about 1290° F.) and frequently at temperatures below about 300° C. (about 572° F.) depending upon the melting temperature of the solder selected. For example, lead-tin (90/10) has a melting temperature of about 230° C. (445° F.), while eutectic gold/tin has a melting point of about 276° C. (528° F.). These lower temperatures for soldering are significant, since the packaged electronic device is designed to function at temperatures of about 200° C. (390° F.). Swaging operations can be performed at ambient temperatures. Unlike brazing operations, which are accomplished at much higher temperatures, well above 700° C., requiring the operations to be accomplished before the cover is attached to the base to prevent damage to the electronics, the soldering operations can be performed after the cover is attached to the base and after the interior of the housing has been degassed. As used herein, the term "low temperature operation," including joining operations, refers to operations such as joining operations performed at temperatures below 700° C., preferably at temperatures below about 500° C. and most preferably at temperatures below about 300° C., the temperatures at which the soldering and swaging operations of the present invention are typically practiced. A related advantage is that the cost of soldering is significantly lower than the cost of brazing. In addition, unlike the braze alloy, the solder alloy is not plated at the conclusion of the operation, so that a source of hydrogen (from plating) is eliminated. Specifically, in the embodiment shown in FIG. 3, after soldering, the port base 330 forms a slight flange under the cover and solder material. Furthermore, the port base 330 has a thin cross-section, allowing any hydrogen to move very quickly across the boundary to the exterior of the package.

FIG. 4 depicts a second embodiment of the present invention. This embodiment differs from the embodiment shown in FIG. 3 in the configuration of the hydrogen diffusion port 420. The hydrogen diffusion port 420 includes a port base 430 having a flange 436 extending under cover 212, and a port top 440 having a flange 442 extending over cover 212. These flanges 436, 442 are formed as the hydrogen diffusion port 420 is installed into aperture 226 and swaged so that port wall 432 contacts the inner diameter of aperture 226. As used herein, the term swaging refers toa process that cold works the workpiece by -flowing metal into a cavity, the walls of which act as a die, by high compressive force or impact. Swaging is particularly amenable to small parts. The swaging operation deforms the metal comprising port 420, forming flanges 436, 442.

The advantages of this embodiment of the invention are that the hermetic seal between the hydrogen diffusion port 420 and the cover 212 is mechanical, and no plating is required. Port 420 can be installed in cover 212 after the cover is welded to the base 210 by weld 218 and after the interior of the housing 214 has been degassed. An obvious related advantage is that the swaging operation is significantly lower than the cost of brazing. In addition, unlike the braze alloy, the mechanical joint formed by the swaging operation is not plated at the conclusion of the operation, so that a source of hydrogen (from plating) is eliminated. A further advantage of installing hydrogen ports by swaging them into the cover is that the flanges 436, 442 formed by the swaging operation will prevent the hydrogen diffusion port 420 from separating from cover 212 in extremely cold conditions, unlike the prior art mechanically attached diffusion windows, as discussed above, wherein the port can separate from the cover. The seal formed by swaging is also more reliable than other mechanical joints.

FIG. 5 depicts a third embodiment of the present invention. This embodiment differs from the embodiment shown in FIG. 3 and 4 in the configuration of the hydrogen diffusion port 520 comprises a port that is swaged into an intermediate metal 550 to form a swaged assembly. The swaged assembly is then soldered into the aperture 226 formed in the cover 212. The configuration of FIG. 5 finds use when it is not possible to effectively swage the diffusion port 520 into the cover 212. This situation occurs when the diffusion port 520 comprises titanium, a material that is well-known to be difficult to swage. The situation can also occur when the material forming the cover 212 lacks sufficient strength to allow a swaging operation to be effectively accomplished, such as when the cover material is too thin. The swaging operation is accomplished in tooling that forms the diffusion port 520 into intermediate metal 550. The swaging operation forms top port flange 542 and port base flange 536 on either side of intermediate metal 550, which may be any suitable metal into which the hydrogen diffusion port 520 can be swaged and which can to soldered to the cover 212. For example, when the cover 212 comprises KOVAR®, KOVAR® also is a suitable intermediate metal. A hydrogen diffusion port 520 comprising titanium or a palladium alloy can be swaged into a bushing comprising the KOVAR® intermediate metal 550 to form an assembly 552. This assembly can be installed into aperture226 and soldered as set forth above using the same materials.

It will be understood that the hydrogen diffusion ports set forth in FIGS. 2, 3, 4 and 5 can be made in a variety of sizes, as necessary to provide the requisite cross-sectional area to remove sufficient hydrogen from the interior of the housing to prevent deterioration. Also, these diffusion ports may have any effective crosssection, even though the description set forth herein sets forth a circular cross section. Although the packaged electronic devices set forth in FIGS. 2–5 depict a single diffusion port, it will also be understood that a plurality of diffusion ports can be included in each device to provide sufficient surface area to assure that any hydrogen that evolves during the life of the packaged electronic device contacts the hydrogen diffusion port. Even though the packaged electronic device has a partial pressure of hydrogen that is zero, that is, it has effectively no hydrogen, as hydrogen devolves from one of its many sources into the interior of the housing, its motion within the housing is classic Brownian motion until it contacts the hydrogen port or contacts the metallic surfaces of the electronic device undesirably forming hydrides, resulting in deterioration of performance leading to drift, and in the most severe cases, failure of the device. Thus, increasing the available surface area of the hydrogen diffusion ports increases the probabilities that the hydrogen molecules will contact the hydrogen diffusion ports so that it can be moved to the exterior of the package.

In yet another embodiment of the present invention, the source of hydrogen is properly reduced by proper selection of the materials comprising housing 214. Since the materials of construction or residual moisture are the major sources for devolved hydrogen which attacks the electronics within the housing, one solution to the problem is to eliminate the source of hydrogen in the materials themselves. As previously noted, sources of hydrogen include plating applied to the exterior of materials comprising the base 210 and the cover 212 in order to protect them from deterioration as a result of exposure to the environment, i.e. corrosion, as well as from the brazing processes used to join the cover to the base, which is typically done under a reducing atmosphere, which comprises at least a partial pressure of hydrogen. This embodiment utilizes any of the hydrogen diffusion ports set forth in FIGS. 2–5 in conjunction with a housing 214 that includes a cover 212 comprising aluminum or aluminum alloys, or simply aluminum-based materials. Most preferable, the housing also includes a base comprising aluminum-based material. The base and the cover are welded together, such as by laser welding. When the base is an aluminum-based material, it typically is necessary to apply intermediate layers of material between the base and the electronic device 216 to accommodate the different coefficients of thermal expansion between the base and the electronic device. These layers, as well as the electronic device, can be bolted to the base. The advantage of using an aluminum-based alloy for the cover, and additionally for the base is that aluminum forms a protect oxide scale over its exterior so that a protective plating, a major source of hydrogen in the housing, is not required. Welding the base to the cover by a process such as laser welding also eliminates brazing as a source of hydrogen. Since the cover includes at least one of the hydrogen diffusion ports set forth in FIGS. 2–5, a path for removal of any hydrogen that is devolved in the interior of the housing is provided to prevent hydrogen build-up. Again, since these hydrogen diffusion ports are either soldered or swaged into to the cover, brazing operations and subsequent plating over the braze joint is eliminated. This preferred embodiment reduces major sources of hydrogen from the packaged electronics device.

Another embodiment envisions utilizing a cover made completely of titanium or titanium alloys, hereinafter titanium-based materials. These titanium-based alloys preferably are comprised of the same titanium materials discussed above with reference to the titanium-based diffusion ports. In this embodiment, the entire cover 212 can serve as a hydrogen diffusion port. While a titanium-based material is an effective window for diffusion of hydrogen from within the interior of the housing, titanium readily forms a surface film of titanium oxide ($TiO_2$), which impedes the diffusion of hydrogen from within the interior of the housing.

In order to provide an effective cover 212 of titanium-based material, it is necessary to treat the titanium-based material. First, a cover of titanium-based material must be provided. Titanium is light in weight and has a tensile strength that is higher than other materials used for covers. So, a titanium-based cover providing the same tensile strength of other covers may be provided with a thinner cross-section, thereby providing a weight advantage over other materials. Alternatively, a titanium-based cover can be provided with the same thickness as other covers, thereby providing a stronger cover than is provided by alternate materials, but reducing its weight advantage. A titanium-based cover must be sufficiently thick so that it does not become saturated with hydrogen, that is to say, the hydrogen content within the titanium-based cover must not be allowed to reach a level sufficient to form detrimental titanium hydrides ($TiH_{1.53}$–$TiH_{1.99}$) The final cover typically has a thickness of about 0.010"–0.060", but preferably has a thickness of about 0.010"–0.030". The provided titanium material must first be treated to remove the titanium oxide from the surface. This oxide surface may extend into the surface for about 5–10 micro inches (5–10×10$^{-6}$ inches). Thus, it is necessary to remove less than about 0.001" from each surface, but more typically about 5–50 micro inches from each surface. This removal can be accomplished by any of a number of techniques, including, for example, mechanical abrasion, chemical etching and electrical discharge machining.

Figure 6:
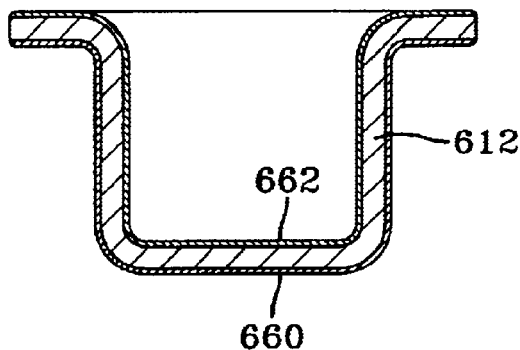
FIG. 6 depicts a sectional view of the present invention depicting a titanium cover comprising a hydrogen diffusion port that is plated to prevent formation of titanium oxide.

Immediately after removing this material, the exposed titanium-based material surface must be protected from oxidation. This is accomplished by applying a coating to the surface. The material selected for the coating must allow hydrogen to migrate through it, yet be substantially impervious to oxygen penetration. A thin layer of gold (Au) or palladium (Pd) is preferred. These coating materials can be applied by any technique that forms a tightly adherent bond with the surface. A plating technique such as an electrodeposition technique or electro less plating may be used. Even though such techniques are the source of hydrogen and are not favored for coating other materials used in a packaged electronic device, they are not deleterious to titanium, as titanium will remove hydrogen from the interior of the electronics package. If a plating method is used to apply the protective layers of either gold or palladium, it is preferred that the cover be baked at an elevated temperature of about 375° F.±25° (190° C.±14°) for at least about 3 hours, as recommended by MIL-G-45204, to remove hydrogen from the coated cover. A preferred method of applying the coating is by sputtering. The thickness of the coating can be carefully controlled, but importantly, the titanium material is not exposed to a plating solution, so that postcoating operations such as baking can be eliminated. FIG. 6 depicts a coated titanium cover 612 having a coating 660 of Au or Pd applied to its outer surface and a similar coating 662 of Au or Pd applied to its inner surface. The coating thickness may be up to about 125 micro inches, but preferably is about 5–50 micro inches.

When the base 210 of housing 214 is titanium-based material or aluminum-based material, the titanium-based material or aluminum-based material cover can be welded to the respective similar metal base to form a hermetic seal. However, when the base is a dissimilar metal, additional steps must be taken to form a weld between the cover and the base. It should be noted that while the cover can be attached to the base by an adhesive and a hermetic seal may be formed, the use of an adhesive is not preferred, as the adhesives can be sources of hydrogen and do not provide as effective a long-range metallic seal as a metallurgical joint such as a solder joint or a weld joint. Thus, to weld a titanium-based cover or an aluminum-based cover to a base such as KOVAR® or Alloy 42, both low expansion steels, either the cover of the base must be modified in order to accomplish the weld. Typically the cover 212 can be clad with the same type of material comprising the base 210. For example, if the base 210 is a KOVAR® material, KOVAR® can be applied to the cover by mechanically cladding the aluminum-based or titanium-based cover with KOVAR® by cold rolling, or by any metallurgical techniques such as laser cladding techniques, inertial welding or explosive welding. Attentively, these techniques can be used to clad aluminum-based or titanium-based to, for example, a KOVAR® base in order to match the material in the cover 212. This will facilitate welding of the cover 212 to the base 210 when the materials of the cover and the base are dissimilar.

Figure 7:
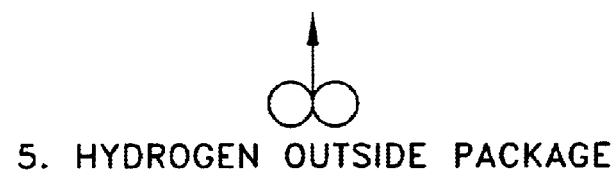
FIG. 7 is a schematic depiction of the events during catalyzed diffusion of hydrogen through Pd/Ag.
Figure 7:
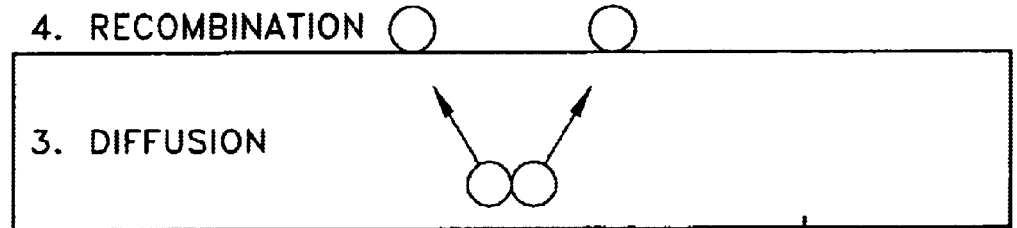

FIG. 7 generally provides a schematic of the mechanism of the transfer of hydrogen from a high partial pressure of hydrogen within a packaged electronics device to a low partial pressure of hydrogen outside the device through a hydrogen port. The rapid hydrogen diffusion through a hydrogen diffusion port occurs by a multistep mechanism of catalyzed diffusion of hydrogen, as illustrated in FIG. 7. Hydrogen molecules ($H_2$) inside the package (step 1) each dissociate (step 2) into two hydrogen atoms (2H) when they encounter the hydrogen diffusion port portion of the package. The dissociated hydrogen atoms diffuse (step 3) through the hydrogen diffusion port much more rapidly than do the undissociated hydrogen molecules. Upon reaching the outside surface of the package 22, the diffusing hydrogen atoms recombine (step 4) to produce hydrogen molecules (step 5) outside the package.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A packaged electronic device, comprising:
   an electronic device; and
   a housing enclosing the electronic device, the housing comprising a base and a cover,
      wherein the base is affixed to the cover by a weld joint to form a first hermetic seal;
      wherein the electronic device is supported on the base; and
      wherein the cover includes an aperture, and a hydrogen diffusion port joined to the aperture by a low temperature joining operation to form a second hermetic seal in the cover.

2. The packaged electronic device of claim 1 wherein the hydrogen diffusion port is joined to the aperture by application of a solder between the port and the cover.

3. The packaged electronic device of claim 1 wherein the hydrogen diffusion port is joined to the aperture by swaging.

4. The packaged electronic device of claim 1 further including an intermediate metal having an intermediate aperture, the intermediate metal positioned between the cover aperture and the hydrogen diffusion port, wherein the hydrogen diffusion port is swaged into the intermediated aperture of the intermediate metal and the intermediate metal is joined to the cover aperture by application of a solder.

5. The packaged electronic device of claim 1 wherein the hydrogen diffusion port is a material selected from the group consisting of palladium, platinum, titanium and their alloys.

6. The packaged electronic device of claim 2 wherein the hydrogen diffusion port is joined to the cover by application of a solder compatible with the cover and the hydrogen diffusion port.

7. The packaged electronic device of claim 2 wherein the base is a material having a coefficient of thermal expansion compatible with the electronic device so that the differential thermal expansion between the electronic device and the base will not adversely affect the operation of the electronic device.

8. The packaged electronic device of claim 7 wherein the base is selected from the group of materials consisting of iron-nickel alloys and iron-nickel-cobalt alloys.

9. The packaged electronics device of claim 7 wherein the cover is selected from the group of materials consisting of aluminum, iron-nickel alloys and iron-nickel-cobalt alloys.

10. The packaged electronic device of claim 9 wherein the hydrogen diffusion port is joined to the aperture by a solder selected from the group consisting of lead/tin; gold/germanium, and gold/tin.

11. The packaged electronic device of claim 1 wherein the cover comprises an aluminum-based material.

12. The packaged electronic device of claim 11 wherein the base comprises an aluminum-based material.

13. The packaged electronic device of claim 11 wherein the cover further includes a layer of the base material bonded to the cover at the interface with the base.

14. The packaged electronic device of claim 11 wherein the base further includes a layer of aluminum-based material bonded to the base at an interface with the cover.

15. The packaged electronic device of claim 4 wherein the intermediate metal comprises a material having substantially the same composition as the cover.

16. A packaged electronic device, comprising:
an electronic device; and
a housing enclosing the electronic device, the housing comprising a base, and a cover selected from the group of materials consisting of titanium and its alloys,
the cover having an inner surface and an outer surface, the inner surface and the outer surface coated with a material selected from the group consisting of Au, Pd and combinations thereof, selected to prevent the formation of titanium oxide, the coated cover forming a hydrogen diffusion port
wherein the base is affixed to the cover by a weld joint to form a hermetic seal;
wherein the electronic device is supported on the base.

17. The packaged electronic device of claim 16 wherein the base comprises a non-titanium material having a coefficient of thermal expansion compatible with the electronic device so that the differential thermal expansion between the electronic device and the base will not adversely affect the operation of the electronic device.

18. The packaged electronic device of claim 17 wherein the base further includes a layer of titanium-based material bonded to the base at an interface with the cover.

19. The packaged electronic device of claim 17 wherein the cover further includes a layer of the base material bonded to the cover at the interface with the base.

20. A method for manufacturing a reduced-hydrogen packaged electronic device that includes a hydrogen port, comprising the steps of
providing an electronic device;
providing a base;
affixing the electronic device to the base;
providing a cover, the cover including an aperture;
welding the cover to the base to form a housing;
degassing the assembly by heating to a temperature in the range of about 100–265° C. for a time sufficient to remove at least some hydrogen from the housing; then
providing a hydrogen diffusion port for the aperture, the hydrogen diffusion port sized to be received by the aperture; and
soldering the hydrogen diffusion port to the aperture to form a hermetically sealed solder joint, wherein the housing is characterized by an absence of plating applied to the base, the cover and the solder joint.

21. The method of claim 20 wherein the step of providing a cover having the aperture includes providing a cover comprising aluminum.

22. The method of claim 20 wherein the step of providing a hydrogen diffusion port includes providing a hydrogen diffusion port selected from the group of materials consisting of palladium and palladium alloys, platinum and platinum alloys and titanium and titanium alloys.

23. A method for manufacturing a packaged electronic device comprising the steps of:
providing an electronic device;
providing a base;
affixing the electronic device to the base;
providing a cover, the cover having an aperture;
welding the cover to the base to form a housing;
degassing the assembly by heating to a temperature in the range of about 100–265° C. for a time sufficient to remove at least some hydrogen from the housing;
providing a hydrogen diffusion port for the aperture, the hydrogen diffusion port sized to be received by the aperture; and
swaging the hydrogen diffusion port to the aperture to form a hermetically sealed swage fitting,
wherein the housing is characterized by an absence of plating applied to the base, the cover and each swage joint.

24. The method of claim 23 wherein the step of swaging the hydrogen diffusion port to the aperture includes the further steps of providing an intermediate material for insertion into each aperture, then swaging the hydrogen diffusion port into the intermediate material, and then soldering the intermediate material to the aperture to form a hermetically sealed solder joint, the housing further characterized by an absence of plating applied to the swage joint and the solder joint.

25. The method of claim 24 wherein the step of providing an intermediate material includes providing an intermediate material having substantially the same material composition as the cover.

26. The method of claim 23 wherein the step of providing a cover having the aperture includes providing a cover comprising aluminum.

27. The method of claim 23 wherein the step of providing a hydrogen diffusion port includes providing a hydrogen diffusion port selected from the group of materials consisting of palladium and palladium alloys, platinum and platinum alloys and titanium and titanium alloys.

28. A method for manufacturing a packaged electronic device comprising the steps of:
providing an electronic device;
providing a base;
affixing the electronic device to the base;
providing a cover comprising a titanium-based material having an inner surface and an outer surface; then
treating the inner and outer surfaces of the titanium-based cover to remove surface titanium oxides; then
immediately applying a protective coating to the treated surfaces of the cover to prevent the formation of titanium oxides;
then degassing the cover at a temperature in the range of about 375° F. ±25° for a time sufficient to remove hydrogen from the cover;
degassing the base by heating to a temperature in the range of about 100–265° C. for a time sufficient to remove at least some hydrogen from the housing; and
welding the degassed cover to the degassed base to form a housing.

29. The method of claim 28 wherein the step of degassing the cover is performed for a time of about three hours.

30. The method of claim 28 wherein the cover comprising the titanium-based material is selected from the group consisting of commercially pure titanium, Ti 6Al -4V and Ti 3Al -2.5V.

31. The method of claim 28 wherein the step of includes coating the cover with a plating selected from the group consisting of Pd and Au up to a thickness of about 125 micro inches.

* * * * *

UNITED STATES PATENT AND TRADEMARK OFFICE
CERTIFICATE OF CORRECTION

| | | |
|---|---|---|
| PATENT NO. | : 6,919,623 B2 | Page 1 of 1 |
| APPLICATION NO. | : 10/735221 | |
| DATED | : July 19, 2005 | |
| INVENTOR(S) | : Evans et al. | |

It is certified that error appears in the above-identified patent and that said Letters Patent is hereby corrected as shown below:

In column 14, line 1, " step of includes" should be -- step of applying a protective coating includes --.

Signed and Sealed this

Fifth Day of September, 2006

JON W. DUDAS
*Director of the United States Patent and Trademark Office*